(12) United States Patent
Naumenko et al.

(10) Patent No.: US 6,661,313 B2
(45) Date of Patent: Dec. 9, 2003

(54) SURFACE ACOUSTIC WAVE DEVICES USING OPTIMIZED CUTS OF LITHIUM NIOBATE (LINBO$_3$)

(75) Inventors: Natalya F. Naumenko, Moscow (RU); Benjamin P. Abbott, Orlando, FL (US)

(73) Assignee: Sawtek, Inc., Orlando, FL (US)

( * ) Notice: Subject to any disclaimer, the term of this patent is extended or adjusted under 35 U.S.C. 154(b) by 4 days.

(21) Appl. No.: 10/003,060

(22) Filed: Oct. 25, 2001

(65) Prior Publication Data

US 2003/0080831 A1 May 1, 2003

(51) Int. Cl.$^7$ ................................. H03H 9/64
(52) U.S. Cl. .................... 333/193; 310/313 A; 333/195
(58) Field of Search ................ 333/193–196; 310/313 R, 313 A, 313 B, 313 C, 313 D (56) References Cited

U.S. PATENT DOCUMENTS

| | | | | |
|---|---|---|---|---|
| 5,760,522 A | * | 6/1998 | Kobayashi et al. | 310/313 A |
| 5,854,527 A | * | 12/1998 | Shimizu et al. | 310/313 A |
| 5,914,645 A | * | 6/1999 | Kobayashi et al. | 333/193 |
| 6,037,847 A | * | 3/2000 | Ueda et al. | 333/193 |

FOREIGN PATENT DOCUMENTS

| | | | |
|---|---|---|---|
| JP | 62-171215 | * | 7/1987 |
| JP | 10-84245 | * | 3/1998 |
| JP | 2001-36378 | * | 2/2001 |

* cited by examiner

*Primary Examiner*—Barbara Summons
(74) *Attorney, Agent, or Firm*—Allen, Dyer, Doppelt, Milbrath & Gilchrist, P.A.

(57) ABSTRACT

A surface acoustic wave device includes a piezoelectric substrate of a single crystal LiNbO$_3$ and an electrode pattern provided on a surface of the piezoelectric substrate which forms a resonator having an electrode thickness in a range of about 0.1% to about 8% of an acoustic wavelength of a surface acoustic wave excited on the surface of the substrate. The piezoelectric substrate has an orientation defined by Euler angles $(\lambda, \mu, \theta)$, with angle $\lambda$ in a range from $-20°$ to $+20°$, angle $\mu$ in a range from about $-45°$ to about $-10°$, and angle $\theta$ in a range from about $(-1.16\lambda-1.5)°$ to $(-1.16\lambda+1.5)°$, wherein one of angle $\lambda$ and $\theta$ is not equal to zero degrees. Such orientations simultaneously combined with an optimized propagation loss at resonant and anti-resonant frequencies provide for improved performance in RF applications.

11 Claims, 13 Drawing Sheets

SURFACE ACOUSTIC WAVE DEVICES USING OPTIMIZED CUTS OF LITHIUM NIOBATE (LINBO₃)

FIELD OF THE INVENTION

The present invention relates generally to surface acoustic wave (SAW) devices and more particularly to a SAW device having improved performance characteristics for application to RF filtering for wireless communications.

BACKGROUND OF THE INVENTION

In the past decade, surface acoustic wave (SAW) filters became widely used in wireless communication systems operating at radio frequencies (RF). One of the most important requirements of SAW filters for RF applications is low insertion loss, which can be provided by utilizing resonant SAW devices formed on a piezoelectric substrates with high electromechanical coupling coefficient. Single crystal of lithium niobate, LiNbO₃, is known as a piezoelectric material with the highest electromechanical coupling coefficients, compared to other substrates utilized in SAW devices. High propagation velocity of acoustic waves is also desirable for high frequency devices. Therefore, leaky surface acoustic waves (LSAW), which exist in rotated Y-cuts of lithium niobate (LN), X-propagation, and which combine a large electromechanical coupling coefficient with a high propagation velocity, are very promising for use in low-loss SAW filters.

Though a leaky wave propagates along the surface with a certain attenuation (propagation loss), which is caused by radiation of bulk waves, the propagation loss tends to zero in a 41°-rotated Y-cut substrate, when the surface is free ("open"), and in 64°-rotated Y-cut substrate, when the surface is covered with infinitely thin metal film ("short"). The reference should be made to K. Yamanouchi (K. Yamanouchi et al, J.Appl.Phys., 1972, v.43, pp.856–862), who first reported LSAW characteristics in rotated Y-cuts of LN. He found that a strong effect of changing electrical boundary condition on LSAW velocity results in high piezoelectric coupling of LSAW in the above-mentioned orientations.

In resonant structures with metal electrodes of certain thickness, the optimal rotation angle of a Y-cut, which provides minimum propagation loss, depends on the thickness. Particularly desirable cuts for certain applications are described by Ueda et al. in U.S. Pat. No. 6,037,847. According to FIG. 14 of this '847 patent, an orientation with nearly zero propagation loss continuously moves from 62° YX to 72° YX substrate surface cut while the Al electrode thickness increases from 0.025Λ to 0.085Λ, (i.e. from 2.5% Λ to 8.5% Λ), where Λ is LSAW wavelength. Similarly, orientations with nearly zero propagation loss were found for electrode patterns containing Cu or Au as a primary component, as functions of metal thickness.

A selected cut and propagation direction in any crystal can be defined in terms of Euler angles $(\lambda, \mu, \theta)$. The U.S. Pat. No. 6,037,847 teaches the use of LiNbO₃ with Euler angles $(\lambda, \mu, \theta)$ such that $\lambda$ and $\theta$ fixed (nominally zero), and $\mu$ varied depending on the metalization type and thickness used. For an electrode pattern containing Al as a primary component and forming a resonator with thickness in the range from 4% Λ to 12% Λ, the preferred rotation angle $\mu$ is greater than −24°, which corresponds to a 66°-rotated YX-cut, and less than −16°, which corresponds to a 74°-rotated YX-cut (the angle of rotation of Y-cut is determined as $\mu'=\mu-90°$). For electrode patterns having Cu as a primary component, with electrode thickness of 1.2% Λ to 3.6% Λ, a rotational angle $\mu$ greater than −24° but less than −16° is selected. For electrode patterns containing Au as a primary component and having thickness in the range of 0.4% Λ to 1.7% Λ, a rotational angle $\mu$ greater than −24° but less than −16° is selected. Thus, this patent claims devices using a rotational angle $\mu$ in the ranges: greater than −24° but less than −16°.

Figure 1:
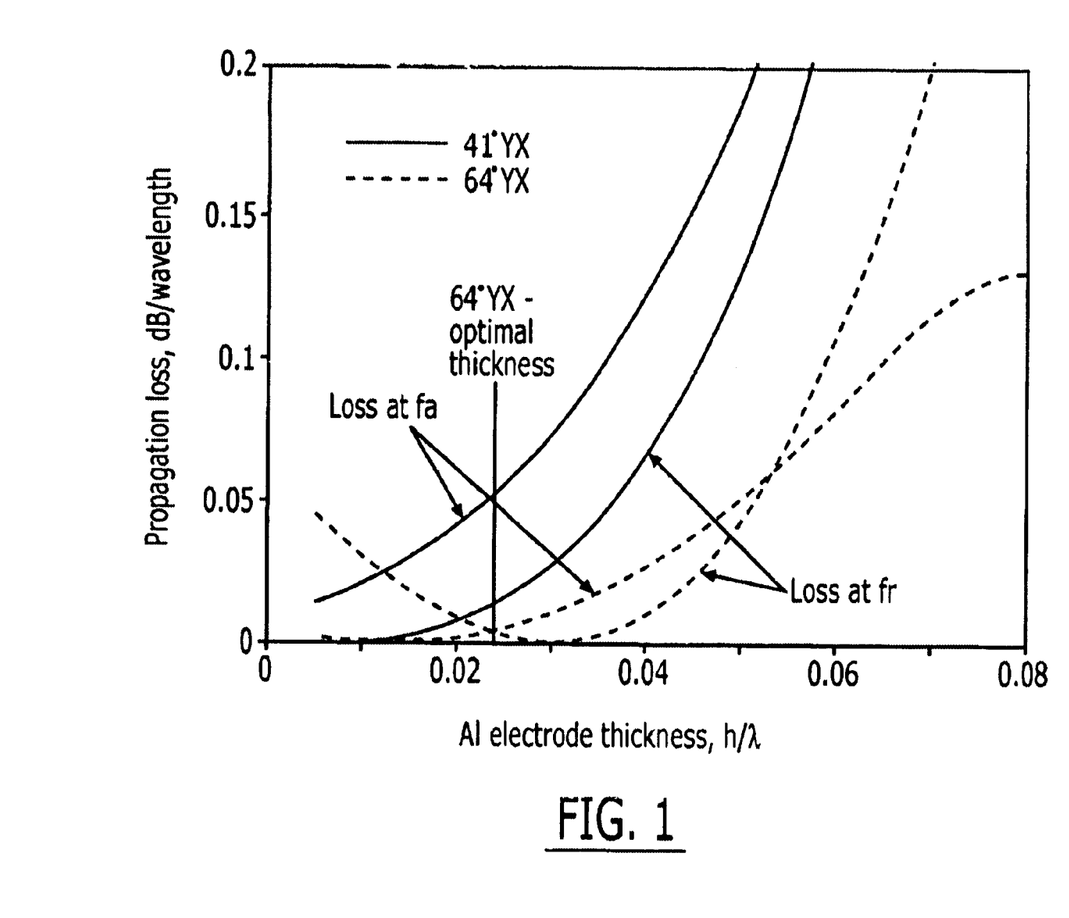
FIG. 1 graphically illustrates propagation losses at resonant and anti-resonant frequencies, for LSAW on 41°-YX and 64°-YX cuts of $LiNbO_3$, as functions of Al electrode thickness normalized to wavelength.

In this instance, the patent does not specifically state what the Euler angles $\lambda$ and $\theta$ are. However, from the description of piezoelectric substrate having an orientation rotated about an X-axis thereof, from a Y-axis thereof, toward a Z-axis thereof, with a rotational angle in a specified range, and the direction of propagation of the surface acoustic wave set in the X-direction [U.S. Pat. No. 6,037,847 Summary of the Invention], it is clear to one skilled in the art that the first Euler angle $\theta$ and the third Euler angle $\theta$ are equal to zero. According to the detailed description of a method used for evaluation of propagation loss due to scattering of LSAW into slow shear bulk waves, reported by Hashimoto (K. Hashimoto et al., Proc. 1997 IEEE Ultrasonics Symposium, pp. 245–254), minimum propagation loss at the lower edge of a stopband of Bragg's reflection, which corresponds to the resonant frequency of LSAW resonator, was chosen as a criterion of optimizing cut angle. However, propagation loss is a function of frequency. FIG. 1 shows calculated propagation loss at resonant and anti-resonant frequencies for 41°-rotated YX cut and 64°-rotated YX cut of LiNbO₃, with Al as electrode material, as functions of electrode thickness normalized to LSAW wavelength, h/Λ. These and other calculations of the present invention were made with material constants of LiNbO₃ reported by Kovacs (G. Kovacs et al. Proc. 1990 IEEE Ultrasonics Symposium, pp.435–438), though it was found that the results do not change significantly if another set of material constants is used, for example, the constants reported by Warner (A. Warner et al, J.Acoust.Soc.Amer., 1967, v.42, pp.1223–1231). In all calculations, the metalization ratio (electrode width to period of grating structure) is assumed to be 0.5.

In 41° YX of LN, both propagation losses, estimated at resonant frequency (fr) and anti-resonant frequency (fa), increase rapidly with Al electrode thickness. In 64° YX of LN, each propagation loss versus normalized thickness dependence has a minimum with nearly zero loss value. This minimum occurs at about 3% Λ and 1.2% Λ for resonant and anti-resonant propagation loss, respectively. Thus, average propagation loss is minimum at approximately 2.4% Λ.

In many applications it is desirable to minimize propagation loss at the center frequency that does not coincide with the resonant or anti-resonant frequency. For example, in ladder filters it is common to have the anti-resonant frequency of the shunt elements approximately equal to the resonant frequency of the series elements. The lower passband edge of a filter is then determined by propagation loss at the resonant frequency of the shunt elements and the upper passband edge is determined by the propagation loss at the anti-resonance of the series elements. Thus, the propagation loss at both frequencies, resonant and anti-resonant, is significant and desirable to be simultaneously minimized. This can be achieved if a minimum average propagation loss, (Lr+La)/2, is used as a criterion of optimal cut angle. Here Lr and La are propagation loss values at resonant and anti-resonant frequencies, respectively. Moreover, if propagation loss is minimized at center frequency, in addition to lower insertion loss, the shape factor of the SAW filter can also be improved. Support for such is found in Unites States patent application for "Surface Acoustic Wave Devices Using Optimized Cuts of a Piezoelectric Substrate" having Ser. No. 09/848,714, the disclosure of which is herein incorporated by reference.

Figure 2:
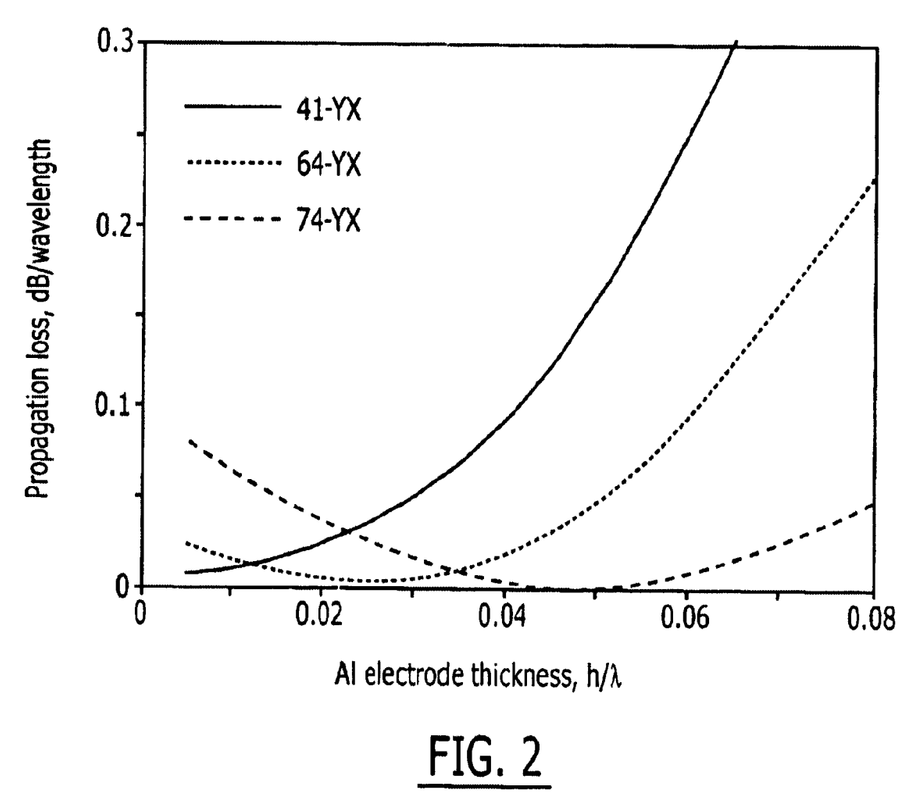
FIG. 2 illustrates average propagation losses (La+Lr)/2 calculated for LSAW on 41°, 64°-YX and 74° YX cuts $LiNbO_3$, as functions of Al electrode thickness normalized to wavelength.

FIG. 2 shows average propagation loss versus Al electrode thickness dependencies in three orientations of LiNbO$_3$, 41°-YX, 64°-X and 74°-YX cuts. It is apparent from this figure that LiNbO$_3$ orientations in the interval from 64°-YX to 74°-YX can provide fairly low propagation loss if the thickness of Al electrode changes between 2.4% and 4.8% Λ. With thicker electrodes, the minimal propagation loss value, which can be obtained in orientations of LiNbO$_3$ from 64°-YX cut to 74°-YX cut, grows with thickness. For example, with increasing Al electrode thickness from 5% Λ to 8% Λ, the minimal average propagation loss that is provided by utilizing 74°-YX cut, grows from 0.001 dB/Λ to 0.05 dB/Λ.

SUMMARY OF THE INVENTION

In view of the foregoing background, it is therefore a general object of the present invention to provide a piezoelectric substrate with novel optimum orientation for use in high frequency (RF) SAW devices, which can eliminate the disadvantages of the prior art substrate orientations.

Another object of the present invention is to provide improved performance for a SAW filter, and in particular to reduce insertion loss and improve shape factor, in SAW filters comprising resonator-type elements, resulting from pre-selected orientations of LiNbO$_3$ with simultaneously optimized propagation loss at resonant and anti-resonant frequencies, while the electrode thickness varies in a wide range from 0.1% Λ to 8% Λ.

By way of example, there is a strong need to provide substrate cuts with fairly low propagation loss (at least less than 0.01 dB/Λ) in the interval of thicknesses from 4.8% Λ to 8% Λ, for electrode pattern with Al as a primary component. Further, there is a need to find desirable substrate cuts with optimized propagation loss when Au is used as a primary component of electrode material, with an electrode thickness in the range from 0.7% Λ to 1.3% Λ and with Cu used as a primary component of electrode material, when electrode thickness is in the range from 1.6% Λ to 2.7% Λ.

Yet another object of the present invention is to provide non-symmetric optimal orientations of LiNbO$_3$, defined by Euler angles (λ, μ, θ) (with λ and θ being nonzero), with a relatively low propagation loss. As will be apparent from the following description of the present invention, the line of non-symmetric orientations in which LSAW has nearly zero propagation loss, crosses a symmetric point with Euler angles (0, μ, 0) in LiNbO$_3$. Such lines of optimal non-symmetric cuts exist for any electrode thickness from zero to 8% Λ. Location of these lines can provide novel orientations with low propagation loss. Moreover, it can provide means to adjust the propagation direction with occasional deviation of a crystal cut plane from a symmetric orientation in order to retain low propagation loss, by way of example.

Another object of the present invention is provide a SAW device, comprising resonator-type elements, with improved performance due to utilizing orientations of LiNbO$_3$ with simultaneously optimized propagation loss at resonant and anti-resonant frequencies, while electrode thickness varies in a wide range from 0.1% Λ to 8% Λ, where Λ is acoustic wavelength.

Another object of the present invention is to provide novel non-symmetric orientations defined by Euler angles (λ, μ, θ) (with λ and θ being nonzero) and having propagation loss less than 0.01 dB/Λ, and electromechanical coupling factor greater than 0.085, while electrode thickness of the pattern is larger than 0.1% Λ and less than 8% Λ.

Another object of the present invention is to provide a possibility to adjust the propagation direction with occasional deviation of a crystal cut plane from a desired symmetric orientation (0, μ, 0), to retain low propagation loss. This is achieved by finding such relationship between Euler angles λ and θ, which describes orientations (λ, μ, θ) with optimized propagation loss, while the angle λ varies from −20° to 20° and angle μ is fixed.

Another object of the present invention is to provide SAW device comprising a piezoelectric substrate of a single crystal LiNbO$_3$ with an electrode pattern disposed on a surface of said piezoelectric substrate and forming resonator; wherein a thickness of a the electrode pattern is in the range from 1% to 8% Λ and Al is used as a primary component of electrode material, a piezoelectric substrate has orientation defined by the Euler angles (λ, μ, θ), with angle λ in the range from −20° to +20°, angle μ in the range from −45° to −10°, and angle θ in the range from (−1.16*λ−1.5)° to (−1.16*λ+1.5)°, and wherein either angles λ or θ are not equal to zero.

Another object of the present invention is to provide SAW device comprising a piezoelectric substrate of a single crystal LiNbO$_3$ with an electrode pattern disposed on a surface of said piezoelectric substrate and forming resonator; wherein thickness of a said electrode pattern is in the range from 0.1% to 1.3% Λ and Au is used as a primary component of electrode material, and wherein a piezoelectric substrate has orientation defined by the Euler angles (λ, μ, θ), with angle λ in the range from −20° to +20°, angle μ in the range from −45° to −10°, and angle θ in the range from (−1.16 *λ−1.5)° to (−1.16*λ+1.5)°, wherein either angles λ or θ are not equal to zero.

Another object of the present invention is to provide SAW device comprising a piezoelectric substrate of a single crystal LiTaO$_3$ with an electrode pattern disposed on a surface of the piezoelectric substrate and forming resonator; wherein a thickness of a the electrode pattern is in the range from 0.2% to 2.7% Λ and Cu is used as a primary component of electrode material, the piezoelectric substrate has orientation defined by the Euler angles (λ, μ, θ), with angle λ in the range from −20° to +20°, angle μ in the range from −45° to −10°, and angle θ in the range from (−1.16*λ−1.5)° to (−1.16*λ+1.5)°, and wherein either angles λ or θ are not equal to zero.

Another object of the present invention is to provide SAW device comprising a piezoelectric substrate of a single crystal LiNbO$_3$ with an electrode pattern disposed on a surface of said piezoelectric substrate and forming resonator, wherein a thickness of a the electrode pattern is in the range from 4.8% to 8% Λ and Al is used as a primary component of electrode material, and wherein a piezoelectric substrate has orientation defined by the Euler angles (0, μ, 0), with angle μ in the range from −16° to −10°.

Another object of the present invention is to provide SAW device comprising a piezoelectric substrate of a single crystal LiNbO$_3$ with an electrode pattern disposed on a surface of said piezoelectric substrate and forming resonator; wherein a thickness of a the electrode pattern is in the range from 0.7% to 1.3% Λ and Au is used as a primary component of electrode material, and wherein a piezoelectric substrate has orientation defined by the Euler angles (0, μ, 0), with angle μ in the range from −16° to −10°.

Another object of the present invention is to provide SAW device comprising a piezoelectric substrate of a single crystal LiNbO$_3$ with an electrode pattern disposed on a surface of said piezoelectric substrate and forming resonator; wherein thickness of a said electrode pattern is in the range from 1.6% to 2.7% Λ and Cu is used as a primary component of electrode material, and wherein a piezoelectric substrate has orientation defined by the Euler angles (0, $\mu$, 0), with angle $\mu$ in the range from −16° to −10°.

DESCRIPTION OF THE PREFERRED EMBODIMENTS

Figure 3:
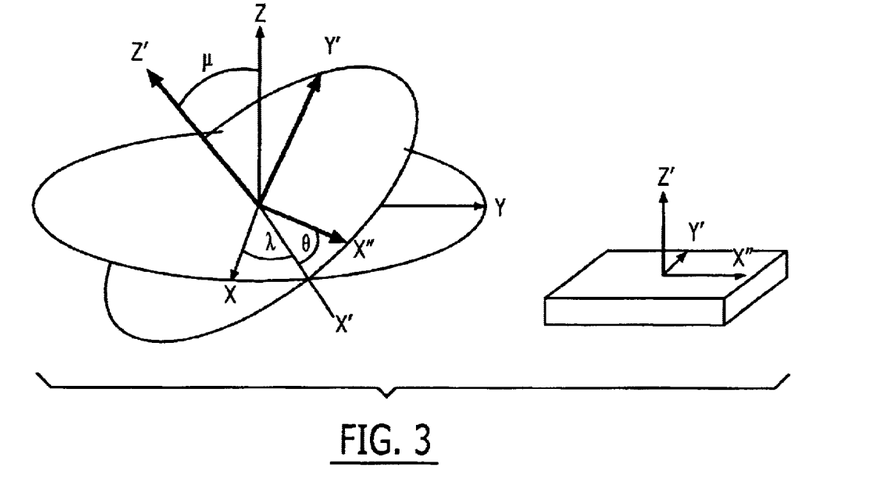
FIG. 3 diagrammatically illustrates orientation of crystal plane and propagation direction in this plane using Euler angles, with reference to initial crystal axes X, Y, Z.

Prior to a detailed description of preferred embodiments of the present invention, an orientation procedure will be described in order to define a substrate cut and propagation direction of LSAW within this cut, according to the specified Euler angles (λ, $\mu$, θ). Reference is now made to FIG. 3. With initial coordinate axes X, Y, Z fixed along crystal axes of $LiNbO_3$, according to the Euler angle convention, first, auxiliary axis X' (positive direction) is obtained by rotation from positive X axis towards positive Y axis by the angle λ. The outward normal to the substrate cut Z' is then found by rotation about auxiliary axis X' from positive Z axis, by the angle $\mu$ counter-clockwise, as viewed from positive X'. Finally, the direction of surface wave propagation X" is found by rotation about Z' from positive X' axis by the angle θ counterclockwise, as viewed from positive Z' axis.

Figure 3A:
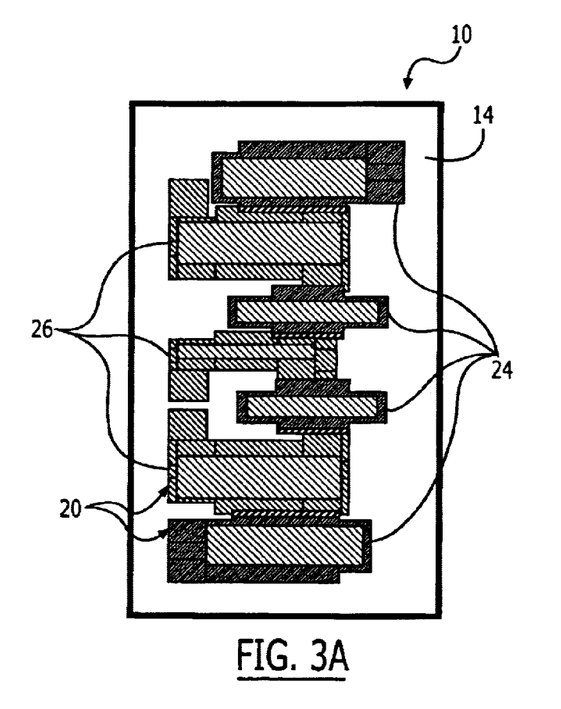
FIG. 3A. is a top plan view illustrating one embodiment of a ladder filter including resonator filters within parallel and series arm thereof.
Figure 3B:
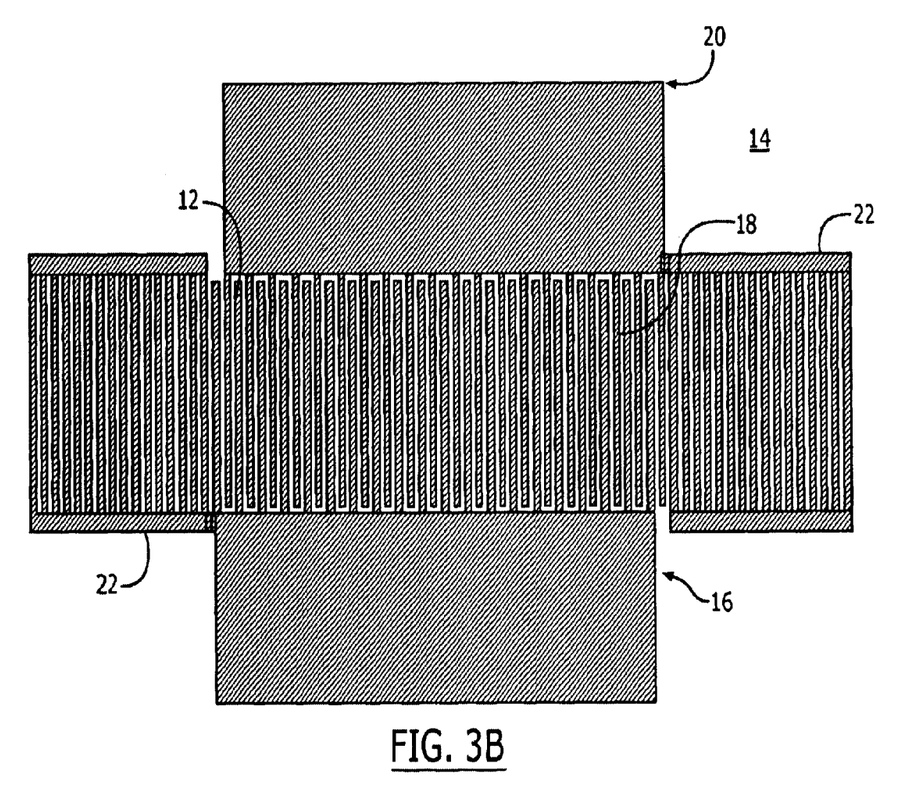
FIG. 3B is a top plan view illustrating on SAW resonator structure including a transducer and reflectors.

A SAW filter may comprise a piezoelectric substrate with electrode patterns used for generation and detection of surface waves or for forming resonators. One embodiment of the present invention, a SAW filter device 10 illustrated with reference to FIGS. 3A and 3B includes electrode patterns 12 deposited on a piezoelectric substrate 14. The electrode patterns 12 may form transducers 16 that may be composed of interdigitized electrodes 18 made of aluminum metal, aluminum alloy or a conductive metal. The electrode patters 12 may be that of a SAW resonator 20 which may be comprised of the transducer 16 and reflectors 22 as illustrated by way of example with reference to FIG. 3B. The SAW resonator 20 may be arranged in a series arm 24 or a parallel arm 26 of a filter device for forming a ladder filter structure as is illustrated herein by way of example. The piezoelectric substrate herein described by way of example may be either Lithium Tantalate ($LiTaO_3$) or Lithium Niobate ($LiNbO_3$). A filter performance depends on the propagation characteristics of SAW in a substrate. If leaky surface waves are used in a SAW device, the propagation loss caused by the nature of leaky waves; that is by radiation of bulk waves into the bulk of a substrate, affects insertion loss, shape factor and other important parameters. Further discussions refer to this type of loss though other mechanisms also contribute to propagation loss. For a specified substrate cut and propagation direction, this propagation loss depends on the details of the filter structure, such as metalization ratio and electrode thickness normalized to wavelength h/Λ. Searches were conducted assuming the electrode patterns contain Al, Cu or Au as a primary component, with metalization ratio a/p=0.5, and spanned a wide range of normalized electrode thickness from 0.1% Λ to 8% Λ. As explained above, simultaneous minimization of propagation loss at resonant and anti-resonant frequencies, that is minimization of average propagation loss (Lr+La)/2, was used as a criterion of optimization.

Figure 4:
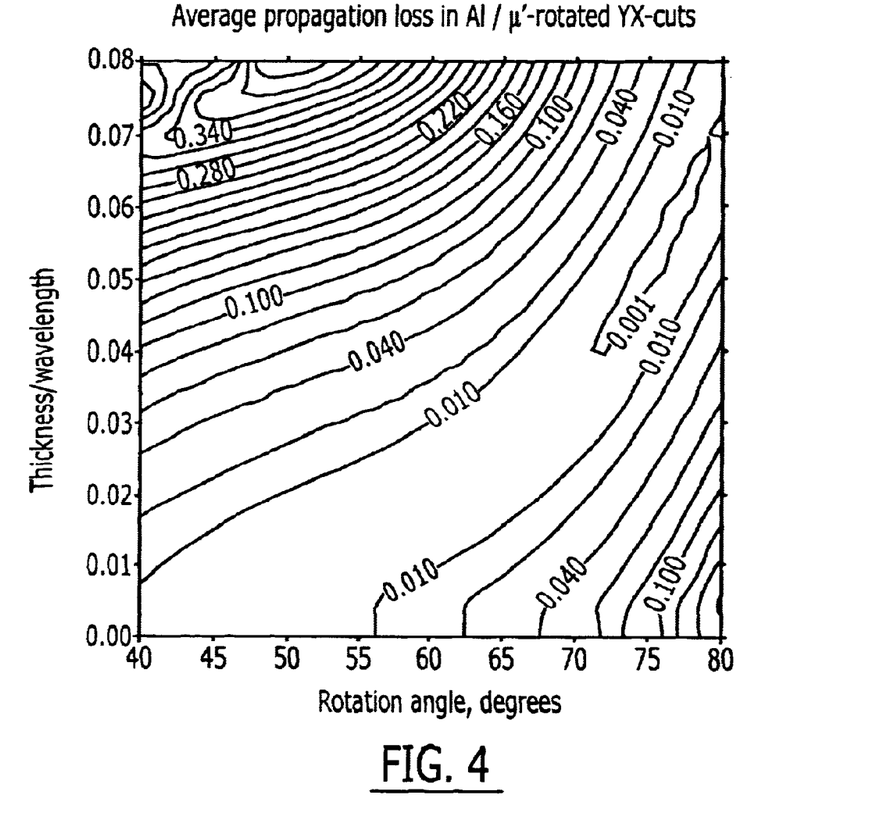
FIG. 4 is a contour plot of average propagation loss, as function of cut angle $\mu'$ and normalized electrode thickness, for pattern with Al electrodes on $\mu'$-rotated YX cut of $LiNbO_3$.
Figure 5:
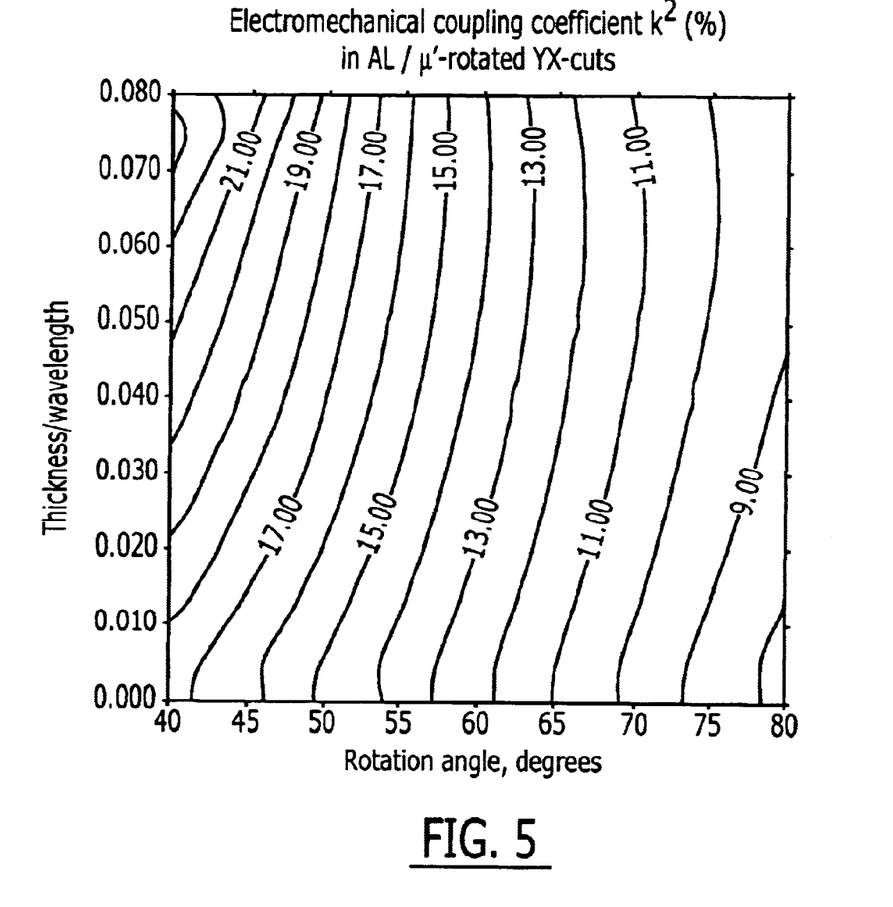
FIG. 5 is a contour plot of electromechanical coupling coefficient, as function of cut angle $\mu'$ and normalized electrode thickness, for pattern with Al electrodes on $\mu'$-rotated YX cut of $LiTaO_3$.

With reference now to FIG. 4, a calculated average propagation loss is illustrated in a contour plot, versus normalized electrode thickness h/Λ and rotation angle $\mu'$ of $\mu'$-rotated YX-cuts of LiNbO$_3$ [Euler angles (0°, $\mu'$–90°, 0°)]. The first and third Euler angles are set equal to zero, and Al is assumed to be a primary component of electrode material. It is clearly seen that for any rotation angle $\mu'$ in the interval from 41° to 80°, an optimal electrode thickness can be found, which provides propagation loss less than 0.01 dB/Λ. In addition to low propagation loss, a high electromechanical coupling coefficient k$^2$ is required to provide low insertion loss in SAW filter. This LSAW characteristic is presented in FIG. 5, as a function of normalized electrode thickness h/Λ and rotation angle $\mu'$. The piezoelectric coupling of LSAW reaches maximum values at $\mu'$ about 40°. However, it exceeds 9% for all analyzed orientations and electrode thickness values.

Figure 6:
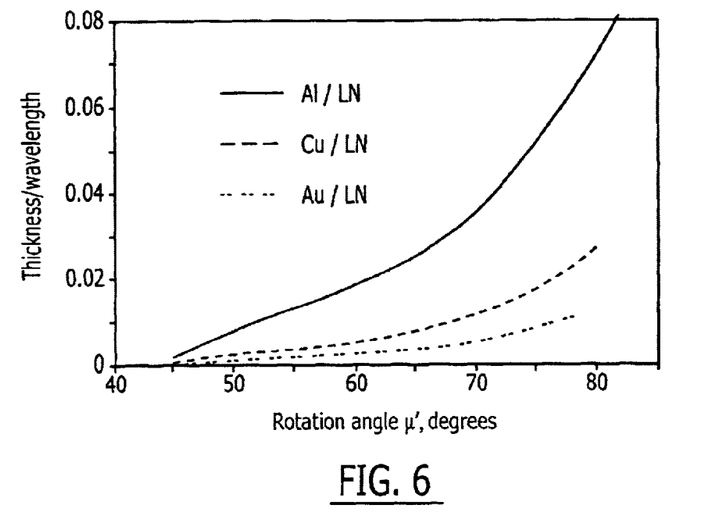
FIG. 6 is a diagram illustrating one relationship between an optimal normalized electrode thickness and cut angle $\mu'$, for $\mu'$-rotated YX cuts of $LiNbO_3$ with Al, Cu and Au as primary components of electrode material.

Similar calculations were made with Cu and Au as a primary component of electrode material, and the optimal thickness versus rotation angle dependence were found for these electrode materials. The lines of minimum loss are shown in FIG. 6 and determine optimal electrode thickness as a function of cut angle for SAW devices having resonant-type elements with Al, Cu or Au as electrode material. For example, a 76°-rotated YX-cut [Euler angles (0°, –14°, 0°)] is an optimal orientation of LiNbO$_3$ with Al electrodes of thickness about 5.5% Λ. With Cu and Au as a primary component of electrode material, the same orientation is optimal with an electrode thickness of about 1.89% Λ and of about 0.91% Λ, respectively.

Figure 7:
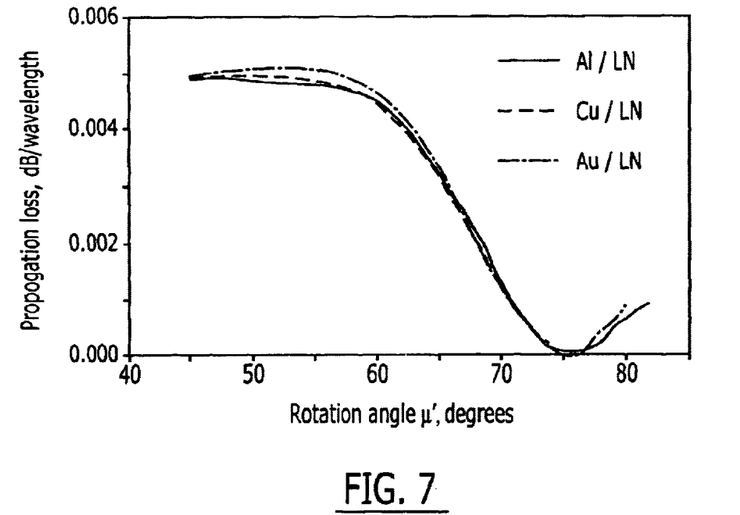
FIG. 7 graphically illustrates average propagation corresponding to the optimized thickness versus rotation angle dependence shown in FIG. 6, for $\mu'$-rotated YX cuts of $LiNbO_3$ with Al, Cu and Au as primary components of electrode material.
Figure 8:
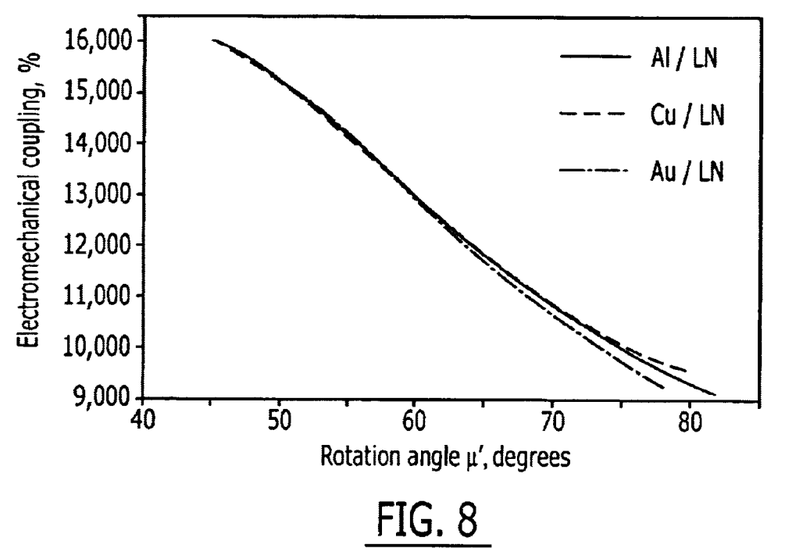
FIG. 8 graphically illustrates electromechanical coupling coefficients corresponding to the optimized thickness versus rotation angle dependence shown in FIG. 6, for $\mu'$-rotated YX cuts of $LiNbO_3$ with Al, Cu and Au as primary components of electrode material.

A detailed study of LSAW characteristics along the lines of minimal loss was then performed. The propagation loss and electromechanical coupling coefficient simulated for each electrode material along the optimal lines are shown in FIG. 7 and FIG. 8, respectively. Both characteristics look similar for different electrode materials, if plotted as functions of rotation angle $\mu'$. The propagation loss does not exceed 0.006 dB/Λ in all analyzed orientations, if optimal electrode thickness is chosen, and tends to zero in a 76°-rotated YX-cut.

Figure 9:
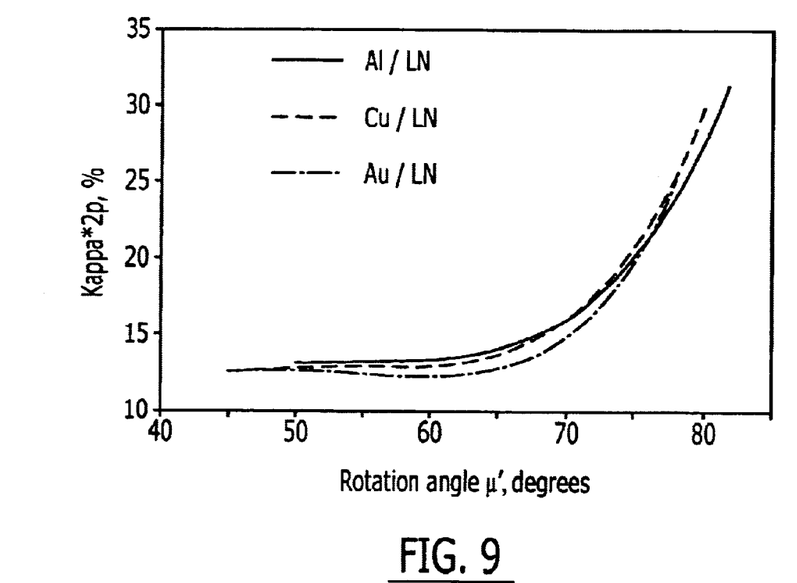
FIG. 9 graphically illustrates the amplitude of reflection coefficient $k*2p$ corresponding to the optimized thickness versus rotation angle dependence shown in FIG. 6, for $\mu'$-rotated YX cuts of $LiNbO_3$ with Al, Cu and Au as primary components of electrode material.

FIG. 9 shows a reflection coefficient per period (2p) of interdigital transducer K*2p, simulated along the line of minimum propagation loss and plotted as function of rotation angle $\mu'$. Together with propagation loss and coupling coefficient, this characteristic helps to estimate minimum insertion loss, which can be obtained in resonator-type filters. Though in such strong piezoelectric materials as LiNbO$_3$, a piezoelectric coupling gives the main contribution into the mechanism of LSAW reflection. However, FIG. 9 illustrates that with increasing electrode thickness and rotation angle along the line of minimum propagation loss, another mechanism of reflection, mass loading, prevails. Therefore, even though electromechanical coupling reduces, the reflection coefficient grows. For example, orientations with rotation angles from 76° to 80° can provide reflection coefficients higher than 20% for any electrode materials considered. Though a higher coupling coefficient can be obtained, for example in a 64°-YX cut, by choosing an optimal electrode thickness 2.4% Λ for Al electrodes, in this cut the reflection coefficient is only 14%.

Figure 10:
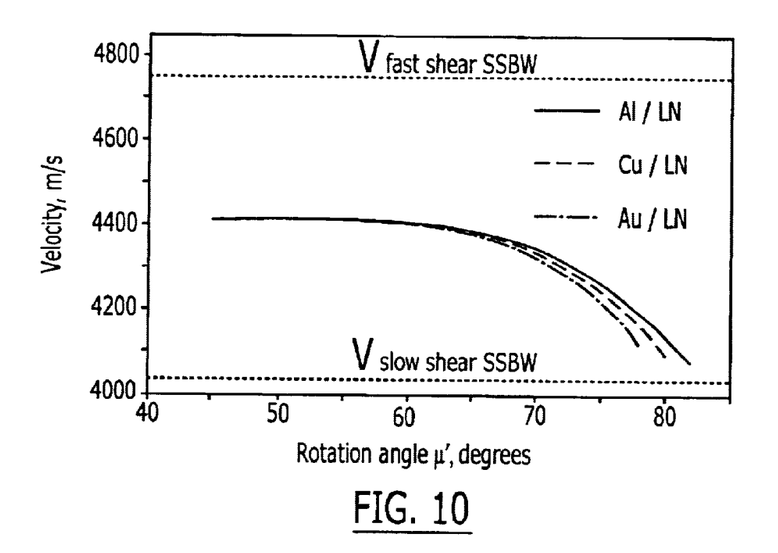
FIG. 10 graphically illustrates LSAW velocity at resonance frequency, which is calculated along the lines of optimized thickness versus rotation angle dependence shown in FIG. 6, for $\mu'$-rotated YX cuts of $LiNbO_3$ with Al, Cu and Au as primary components of electrode material.

FIG. 10 shows LSAW velocity at resonance frequency with respect to the limiting velocities of slow shear and fast shear bulk waves. The illustration of FIG. 10 demonstrates that with rotation angles exceeding 80°, the slow shear bulk wave can give undesired resonance close to the main passband of a SAW filter. Therefore, the recommended rotation angle $\mu'$ of $\mu'$-rotated YX cut must not be higher than 80° and the corresponding maximum optimal thickness is about 8% Λ for Al electrodes, about 2.7% Λ for Cu electrodes and about 1.3% Λ for Au electrodes. For metal thicknesses greater than 10%, the nature of the wave changes from leaky wave to surface wave resulting in a reduced velocity, which while of interest is not the subject of the present invention.

Thus, according to FIGS. 7–10, for gratings with Al electrode thickness from 4.8% Λ to 8% Λ for the case with the first and third Euler angles (λ and θ) fixed at (nominally) zero, the optimal rotational angle $\mu'$ was found to be greater than 74° but less than 80°. For the same case, with Au as a primary component of electrode material, the optimal rotational angle $\mu'$ was found to be greater than 74° but less than 80° when electrode thickness changes within the range from 0.7% Λ to 1.3% Λ, and with Cu as a primary component of electrode material, the optimal rotational angle $\mu'$ was found to be greater than 74° but less than 80°, when electrode thickness changes within the range from 1.6% Λ to 2.7% Λ. A preferred embodiment of the present invention has the value of $\mu'$ nominally equal to 76°, or Euler angles (0°, –14°, 0°).

As discussed above, a deviation of crystal orientation from a symmetric cut (0°, $\mu$, 0°) does not necessarily cause a significant increase of propagation loss, provided that the deviation of a substrate plane is followed by proper rotation of propagation direction within this plane. Therefore, a more general search including non-symmetric cuts, resulted in the discovery of a broader range of orientations with desirable propagation characteristics and power flow angle non-zero but relatively small and thus manageable during device design. With Euler angle $\mu$ fixed within the interval from –50° to –10°, the search spanned a range of angles λ from –30° to 30° and θ from –5° to 5° For each analyzed $\mu$, the electrode thickness was set to be optimal, according to the relations shown in FIG. 6.

Figure 11:
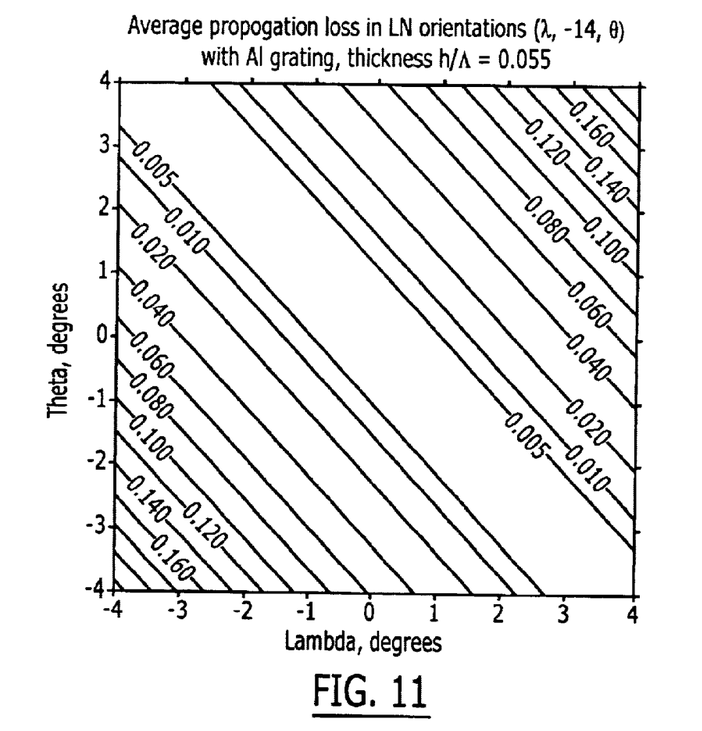
FIG. 11 is a contour plot of average propagation loss, as function of angles λ and θ, for pattern of Al electrodes with thickness 5.5% Λ, disposed on $LiNbO_3$ substrates defined by Euler angles (λ, −14°, θ). The line of optimal non-symmetric orientations is described by θ=−1.16λ.
Figure 12:
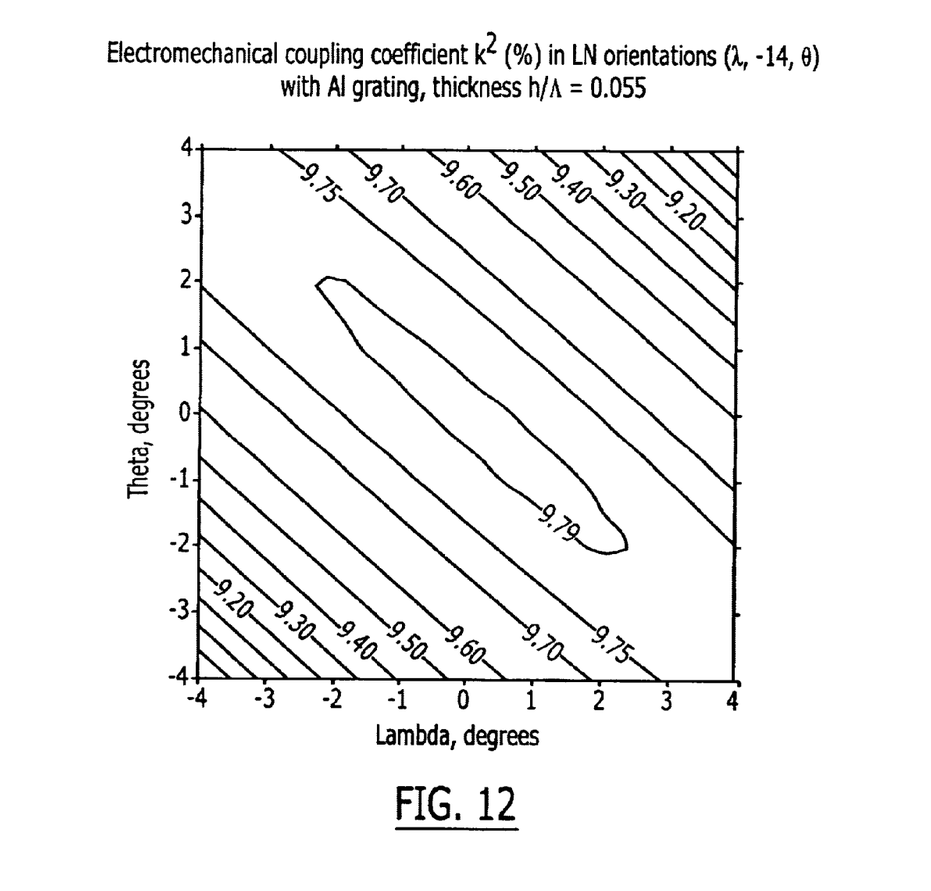
FIG. 12 is a contour plot of electromechanical coupling coefficient, as function of angles λ and θ, for pattern of Al electrodes with thickness 10% Λ, disposed on $LiNbO_3$ substrates defined by Euler angles (λ, −14°, θ)
Figure 13:
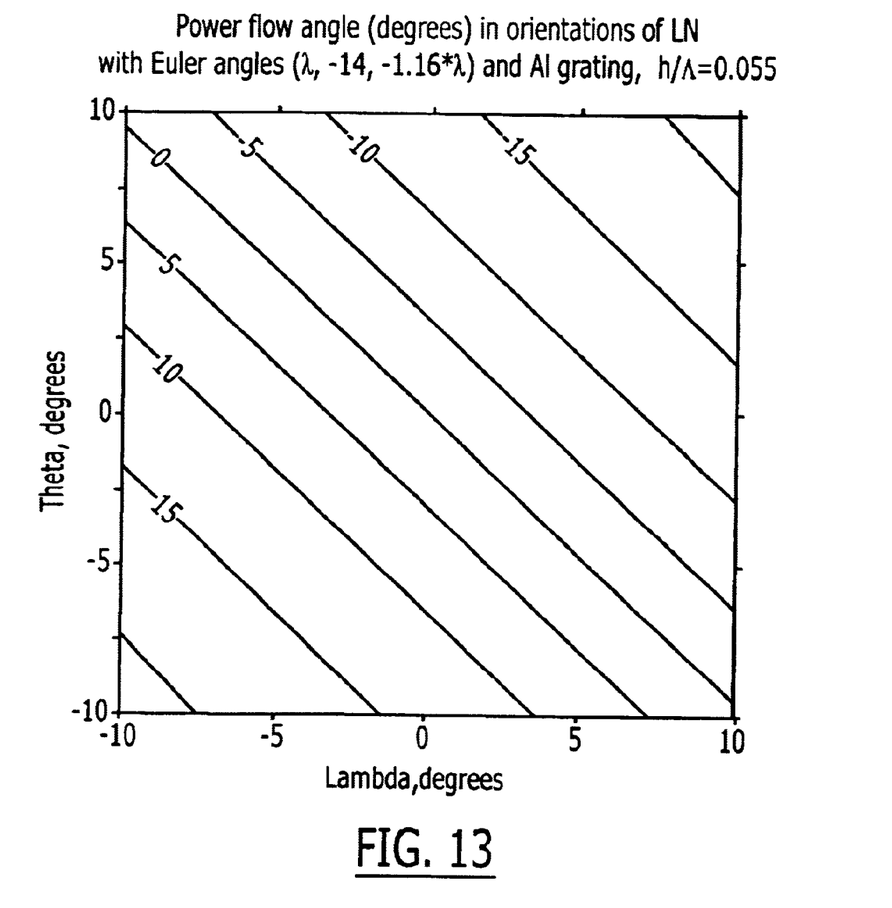
FIG. 13 is a contour plot of power flow angle, as function of angles λ and θ, for pattern of Al electrodes with thickness 10% Λ, disposed on $LiNbO_3$ substrates defined by Euler angles (λ, −14°, θ)
Figure 14:
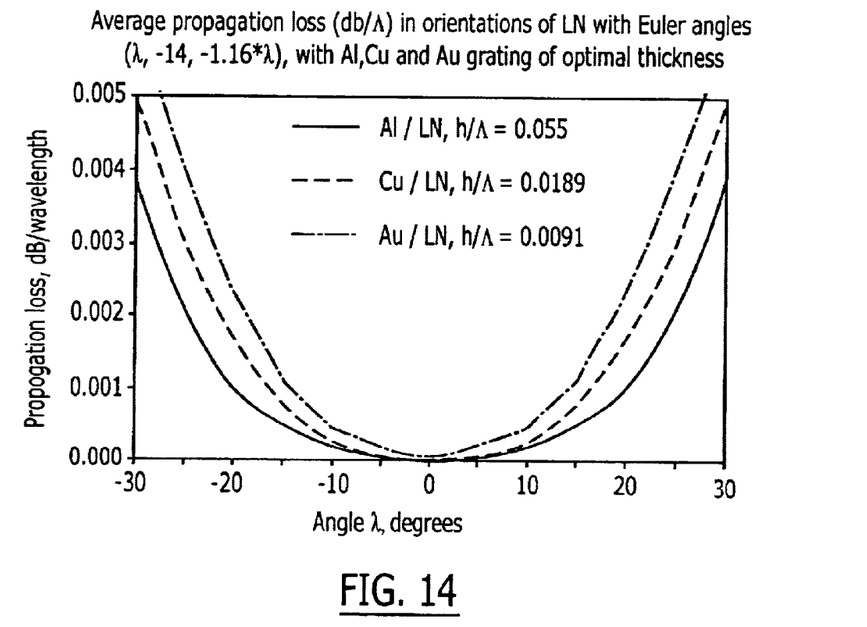
FIG. 14 graphically illustrates average propagation losses in orientations defined by Euler angles (λ, −14°, −1.16*λ) for three patterns, with Al electrodes of 5.5% Λ thickness, with Cu electrodes of 1.89% Λ thickness, and with Au electrodes of 0.91% Λ thickness.
Figure 15:
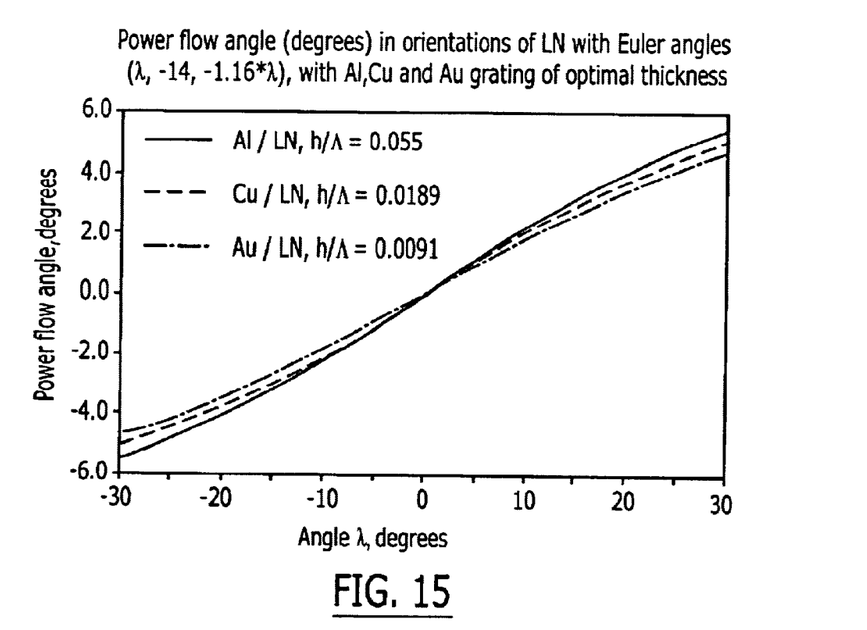
FIG. 15 graphically illustrates power flow angles of LSAW in orientations defined by Euler angles (λ, −14°, −1.16*λ) for three patterns, with Al electrodes of 5.5% Λ thickness, with Cu electrodes of 1.89% Λ thickness, and with Au electrodes of 0.91% Λ thickness.
Figure 16:
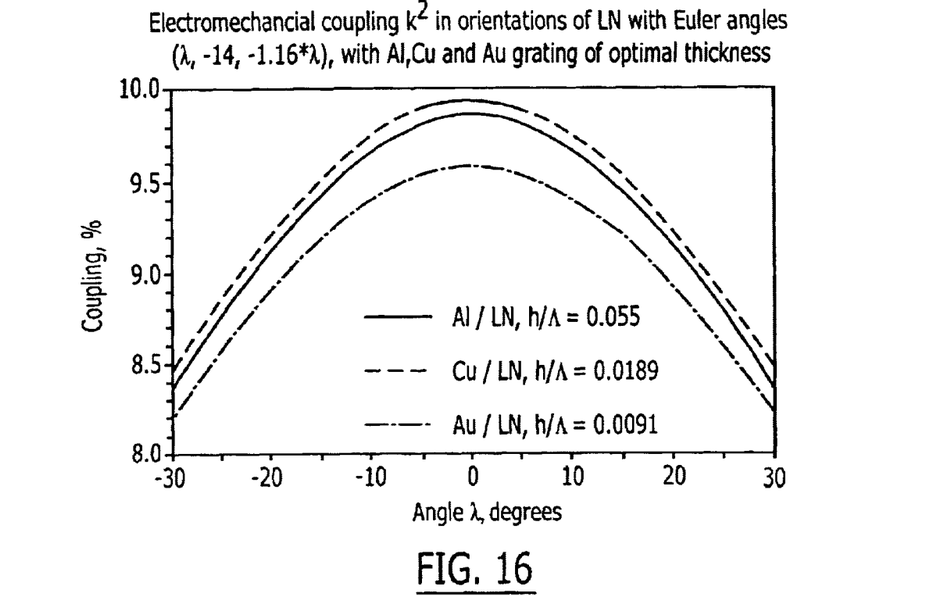
FIG. 16 graphically illustrates electromechanical coupling coefficients in orientations defined by Euler angles (λ, −14°, −1.16*λ) for three patterns, with Al electrodes of 5.5% Λ thickness, with Cu electrodes of 1.89% Λ thickness, and with Au electrodes of 0.91% Λ thickness.
Figure 17:
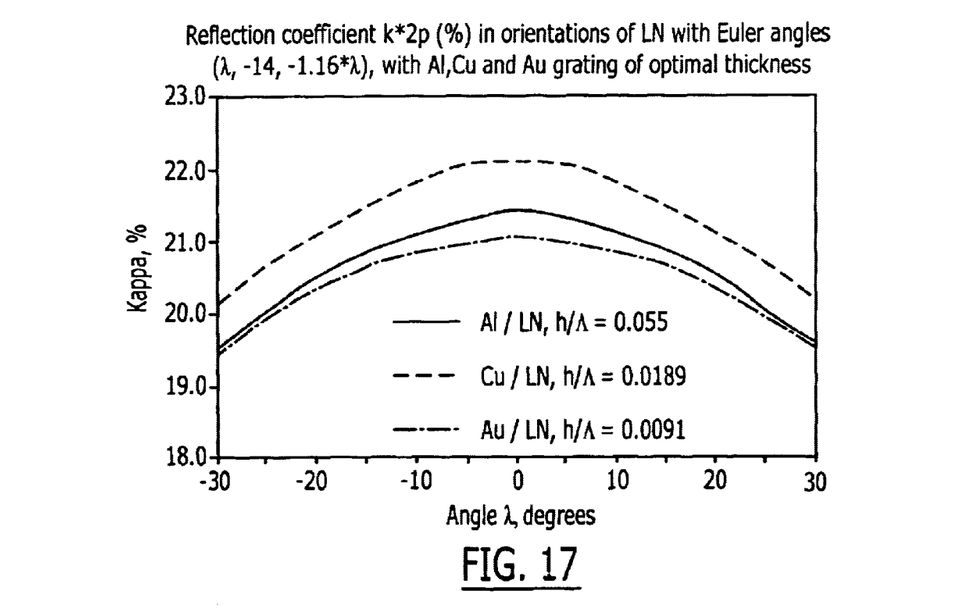
FIG. 17 graphically illustrates the amplitude of reflection coefficient $K*2p$ in orientations defined by Euler angles (λ, −14°, −1.16*λ) for three patterns, with Al electrodes of 5.5% Λ thickness, with Cu electrodes of 1.89% Λ thickness, and with Au electrodes of 0.91% Λ thickness.

By way of further example, orientations with Euler angles (λ, –14°, θ), ($\mu'$=76°) will be further discussed. Al is utilized as electrode material, with optimized electrode thickness 5.5% Λ. Contour plots of average propagation loss, electromechanical coupling coefficient and power flow angle (FIG. 11, FIG. 12 and FIG. 13, respectively), show these LSAW characteristics as functions of angles λ and θ. The lines of minimum propagation loss in FIG. 11 are described approximately by the following relationship: θ=–1.16*λ. In any orientation described by the aforementioned relationship, with λ larger than –20° and smaller than +20°, propagation losses at resonant and anti-resonant frequencies do not exceed 0.001 dB/Λ and k2 is higher than 9%. These values are close to that of symmetric orientation (0°, –14°, 0°) (76°-YX cut), in which k2=9.8% and the propagation loss is about zero. The absolute value of power flow angle grows with increasing λ but does not exceed 4° when –20°<λ<20°.

Further calculations have shown that the relationship θ=–1.16*λ adequately describes non-symmetric lines θ (λ)

for any $\mu$ fixed in the interval from −45° to −10°, if electrode thickness is set optimal for each $\mu$, according to FIG. 6, to provide minimum average propagation loss. Moreover, the same relationship can be referred to non-symmetric lines of optimal orientations ($\lambda$, $\mu$, $\theta$) with $\mu$ fixed in the interval from −45° to −10°, when Au or Cu is a primary component of electrode material. This is illustrated by FIGS. 14, 15, 16 and 17 showing respectively average propagation loss, power flow angle, electromechanical coupling coefficient and reflection coefficient, versus angle $\lambda$ in LiNbO$_3$ orientations ($\lambda$, −14°, −1.16*$\lambda$) with patterns of Al electrodes of 5.5% $\Lambda$ thickness, Cu electrodes of 1.89% $\Lambda$ thickness, and Au electrodes of 0.91% $\Lambda$ thickness. In all three cases, average propagation loss does not exceed 0.003 dB/$\Lambda$ and k2 is greater than 8.7%, if −20°<$\lambda$<20°, while absolute value of power flow angle is less than 4° and reflection coefficient exceeds 20%.

Thus, for the case of nonzero first and third Euler angles, the first Euler angle $\lambda$ is set to be non-zero and less than 20° by its absolute value. A nominal value for $\lambda$ would be $\lambda$=+10°. The second Euler angle $\mu$ can be selected within a fairly wide range such that $\mu$ is greater than −45° but less than −10°. A preferred embodiment of this second invention restricts the second Euler angle such that $\mu$ is greater than −16° and less than −10°. The third Euler angle, $\theta$, has a fixed relationship to the first Euler angle, $\theta$=−1.16*$\lambda$. Thus, the nominal value for $\theta$ in a preferred embodiment is $\theta$=11.05°.

It is to be understood that even though numerous characteristics and advantages of the present invention have been set forth in the foregoing description, together with details of the structure and function of the invention, the disclosure is illustrative only, and changes may be made in detail, especially in the choice of type of SAW device, device orientation on the die, and shape size and arrangement of parts within the principles of the invention to the full extent indicated by the broad general meaning of the terms in which the appended claims are expressed.

That which is claimed is:

1. A surface acoustic wave device comprising:
a piezoelectric substrate of a single crystal LiNbO$_3$; and
an electrode pattern provided on a surface of said piezoelectric substrate, wherein said electrode pattern forms a resonator having an electrode thickness in a range of about 0.1% $\Lambda$ to about 8% $\Lambda$, where $\Lambda$ is an acoustic wavelength of a surface acoustic wave excited on a said piezoelectric substrate, and wherein
said piezoelectric substrate has an orientation defined by Euler angles ($\lambda$,$\mu$,$\theta$), with angle $\lambda$ in the range from −20° to 20°, angle $\mu$ in a range from about −45° to about −10 , and angle $\theta$ in a range from about (−1.16$\lambda$−1.5)° to (−1.16$\lambda$+1.5)°, wherein one of said angle $\lambda$ and $\theta$ is not equal to zero degrees.

2. A surface acoustic wave device as recited in claim 1, wherein $\lambda$ has a value of about +10°, angle $\mu$ is greater than −45° and less than −10°, and angle $\theta$ has a fixed relation to $\lambda$ such that $\theta$ is defined as having a value approximately −1.16$\lambda$.

3. A surface acoustic wave device as recited in claim 2, wherein $\theta$=11.05°.

4. A surface acoustic wave device as recited in claim 1, wherein a primary material of said electrode comprises Al.

5. A surface acoustic wave device as recited in claim 1, wherein primary material of said electrode comprises Au, and wherein said electrode thickness ranges from 0.1% $\Lambda$ to about 1.3% $\Lambda$.

6. A surface acoustic wave device as recited in claim 1, wherein a primary material of said electrode comprises Cu, and wherein said electrode thickness ranges from 0.2% $\Lambda$ to about 2.7% $\Lambda$.

7. A surface acoustic wave device comprising:
a piezoelectric substrate of a single crystal LiNbO$_3$; and
an electrode pattern provided on a surface of said piezoelectric substrate, wherein said electrode pattern forms a resonator having a resonant frequency and an anti-resonant frequency, the resonator having an electrode thickness in a range of about 0.1% $\Lambda$ to 8% $\Lambda$, where $\Lambda$ is an acoustic wavelength of a leaky surface acoustic wave which predominately comprises a shear wave component excited on said piezoelectric substrate, and wherein
said piezoelectric substrate has a non-symmetric orientation defined by Euler angles ($\lambda$,$\mu$,$\theta$), wherein one of said angle $\lambda$ and $\theta$ is not equal to zero degrees, and characteristics include a propagation loss at about the resonant frequency and at about the anti-resonant frequency of the resonator less than 0.01 dB/$\Lambda$ and an electromechanical coupling factor greater than 0.085.

8. A surface acoustic wave device comprising:
a piezoelectric substrate of a single crystal LiNbO$_3$; and
an electrode pattern provided on a surface of said piezoelectric substrate, wherein said electrode pattern forms a plurality of resonators, said plurality of resonators arranged in a least one of a series arm and a parallel arm so as to form a ladder filter structure, each of said resonators having a resonant frequency and an anti-resonant frequency, and wherein the propagation loss of at least one of the resonators is less than 0.01 dB/$\Lambda$ at about the resonant frequency and at about the anti-resonant frequency, each of said resonators having an electrode thickness in a range of about 4.8% $\Lambda$ to about 8% $\Lambda$, where $\Lambda$ is acoustic wavelength of a surface acoustic wave excited on a said piezoelectric substrate, and wherein a primary material component of said electrode comprises Al, and wherein
said piezoelectric substrate has an orientation defined by Euler angles ($\lambda$,$\mu$,$\Lambda$), with angle $\lambda$ equal to about 0°, angle $\mu$ has a value greater than −16° and less than or equal to −10°, and angle $\theta$ about 0°.

9. A surface acoustic wave device comprising:
a piezoelectric substrate of a single crystal LiNbO$_3$; and
an electrode pattern provided on a surface of said piezoelectric substrate, wherein said electrode pattern forms a plurality of resonators, said plurality of resonators arranged in at least one of a series arm and a parallel arm so as to form a ladder filter structure, each of said resonators having a resonant frequency and an anti-resonant frequency, and wherein the propagation loss of at least one of the resonators is less than 0.01 dB/$\Lambda$ at about the resonant frequency and at about the anti-resonant frequency, each of said resonators having an electrode thickness in a range of about 0.7% $\Lambda$ to about 1.3% $\Lambda$, where $\Lambda$ is acoustic wavelength of a surface acoustic wave excited on a said piezoelectric substrate, and wherein a primary material component of said electrode comprises Au, and wherein
said piezoelectric substrate has an orientation defined by Euler angles ($\lambda$,$\mu$,$\theta$), with angle $\lambda$ equal to less 0°, angle $\mu$ has a value greater than −16° and less than or equal to −10°, and angle $\theta$ about 0°.

10. A surface acoustic wave device comprising:

a piezoelectric substrate of a single crystal $LiNbO_3$; and an electrode pattern provided on a surface of said piezoelectric substrate, wherein said electrode pattern forms a plurality of resonators, said plurality of resonators arranged in at least one of a series arm and a parallel arm so as to form a ladder filter structure, each of said resonators having a resonant frequency and an anti-resonant frequency, and wherein the propagation loss of at least one of the resonators is less than 0.01 dB/Λ at about the resonant frequency and at about the anti-resonant frequency, each of said resonators having an electrode thickness in a range of about 1.6% Λ to about 2.7% Λ, where Λ is acoustic wavelength of a surface acoustic wave excited on said piezoelectric substrate, and wherein a primary material component of said electrode comprises Cu, and wherein said piezoelectric substrate has an orientation defined by Euler angles (λ,μ,θ), with angle λ equal to about 0°, angle μ has a value greater than −16° and less than or equal to −10°, and angle θ equal to about 0°.

11. A surface acoustic wave device comprising:

a piezoelectric substrate of a single crystal $LiNbO_3$; and an electrode pattern provided on a surface of said piezoelectric substrate, wherein said electrode pattern forms a resonator having a resonant frequency and an anti-resonant frequency, wherein the propagation loss of the resonator is less than 0.01 dB/Λ at about the resonant frequency and at about the anti-resonant frequency, wherein electrodes within said electrode pattern having an electrode thickness in a range of about 1% Λ to about 8% Λ, where Λ is acoustic wavelength of a surface acoustic wave excited on said piezoelectric substrate, and wherein said piezoelectric substrate has an orientation defined by Euler angles (λ,μ,θ), with angles λ and θ equal to about 0°, and angle μ has a value greater than −14° and less than or equal to −10°.

* * * * *